United States Patent
Kim et al.

(10) Patent No.: US 10,656,313 B2
(45) Date of Patent: May 19, 2020

(54) METHOD FOR MANUFACTURING LIGHT SCATTERING FILM

(71) Applicant: SAMSUNG DISPLAY CO., LTD., Yongin-si, Gyeonggi-Do (KR)

(72) Inventors: Geebum Kim, Suwon-si (KR); Minwoo Kim, Hwaseong-si (KR); Woongsik Kim, Hwaseong-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 288 days.

(21) Appl. No.: 15/454,622

(22) Filed: Mar. 9, 2017

(65) Prior Publication Data

US 2017/0261659 A1   Sep. 14, 2017

(30) Foreign Application Priority Data

Mar. 10, 2016   (KR) .................. 10-2016-0029007

(51) Int. Cl.
*G02B 5/02* (2006.01)
*H01L 51/52* (2006.01)

(52) U.S. Cl.
CPC ......... *G02B 5/0268* (2013.01); *G02B 5/0247* (2013.01); *G02B 5/0278* (2013.01); *H01L 51/5268* (2013.01)

(58) Field of Classification Search
CPC .. G02B 5/0247; G02B 5/0268; G02B 5/0278; H01L 51/5268
See application file for complete search history.

(56) References Cited

U.S. PATENT DOCUMENTS

| | | | | |
|---|---|---|---|---|
| 3,648,428 | A * | 3/1972 | Colburn | B65B 11/52 53/428 |
| 2002/0154256 | A1* | 10/2002 | Gotoh | G02F 1/133615 349/65 |
| 2005/0151226 | A1* | 7/2005 | Takeuchi | H01L 51/5262 257/612 |
| 2013/0247729 | A1* | 9/2013 | Boyer, Jr. | B26F 1/24 83/30 |
| 2015/0102325 | A1 | 4/2015 | Lim et al. | |
| 2015/0171373 | A1* | 6/2015 | Hirasawa | G02B 5/1866 257/40 |
| 2015/0259119 | A1* | 9/2015 | Duan-Arnold | B65D 77/26 206/570 |

FOREIGN PATENT DOCUMENTS

| | | |
|---|---|---|
| JP | 11-254396 | 9/1999 |
| JP | 2005-081470 | 3/2005 |
| KR | 10-2015-0042937 | 4/2015 |

* cited by examiner

*Primary Examiner* — Mark A Osele
*Assistant Examiner* — Christopher C Caillouet
(74) *Attorney, Agent, or Firm* — F. Chau & Associates, LLC

(57) ABSTRACT

A method of manufacturing a light scattering film, the method includes providing a light transmissive base having a film shape. A plurality of holes is defined in the light transmissive base, using a perforating device. Each of the plurality of holes has a diameter ranging from about 100 nm to about 5 μm. A spacing between each of the plurality of holes is about twice to about five times as large as an average diameter of each of the plurality of holes.

15 Claims, 11 Drawing Sheets

METHOD FOR MANUFACTURING LIGHT SCATTERING FILM

This application claims priority under 35 U.S.C. § 119 to Korean Patent Application No. 10-2016-0029007, filed on Mar. 10, 2016, the content of which is herein incorporated by reference in its entirety.

TECHNICAL FIELD

Exemplary embodiments of the invention relate to a light scattering film, and more specifically, to a method of manufacturing a light scattering film.

DISCUSSION OF THE RELATED ART

In recent times, flat panel display ("FPD") devices which display an image using a liquid crystal display ("LCD") panel, a plasma display panel ("PDP"), an electroluminescence ("EL") display panel, or an organic light emitting diode ("OLED") display panel are garnering attention.

Such a display device may include various optical films to provide desired display properties. Examples of the optical films that may be used include a light scattering film and a polarization film. Such films may be manufactured using a mechanical method or a chemical method.

SUMMARY

A method of manufacturing a light scattering film, the method includes providing a light transmissive base having a film shape. A plurality of holes is defined in the light transmissive base, using a perforating device. Each of the plurality of holes has a diameter ranging from about 100 nm to about 5 μm. A spacing between each of the plurality of holes is about twice to about five times as large as an average diameter of each of the plurality of holes.

A method of manufacturing a light scattering film, the method includes providing a light transmissive base having a film shape. A plurality of recessed portions is defined in the light transmissive base, using a perforating device. Each of the plurality of recessed portions has a depth that is smaller than a thickness of the light transmissive base and has a diameter ranging from about 100 nm to about 5 μm.

A method of manufacturing a light scattering film, the method includes providing a light transmissive base having a film shape. A crack is created on a surface of the light transmissive base by colliding a bead into the light transmissive base. The light transmissive base is selectively etched using an etching solution.

A method for manufacturing a polarizing film includes preparing a light scattering film by punching a plurality of holes into a transmissive base film using one or more microneedles. The prepared light scattering film is disposed on a polarizer. One or more supporting members is disposed on the light scattering film. A hard coating layer is formed over the one or more supporting members.

BRIEF DESCRIPTION OF THE DRAWINGS

The above and other features and aspects of the present disclosure of invention will be more clearly understood from the following detailed description taken in conjunction with the accompanying drawings, in which.

DETAILED DESCRIPTION

Figure 1:
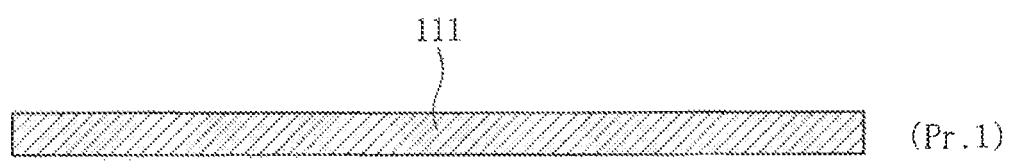
FIG. 1 is a manufacturing diagram illustrating a light scattering film according to an exemplary embodiment of the present inventive concept.
Figure 1:
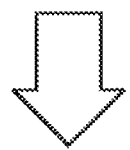
Figure 1:
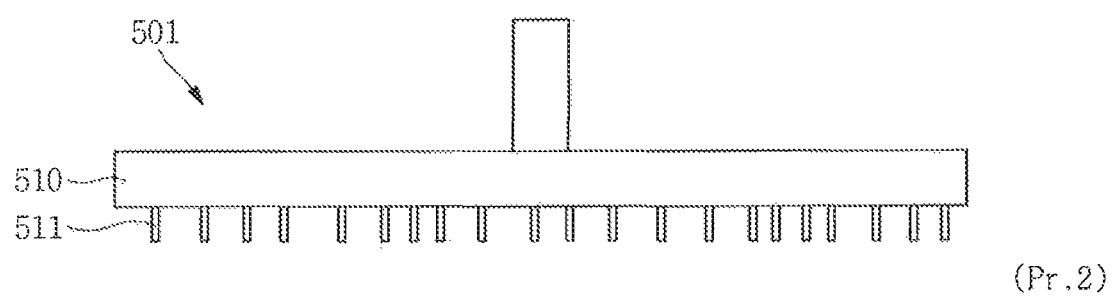
Figure 1:
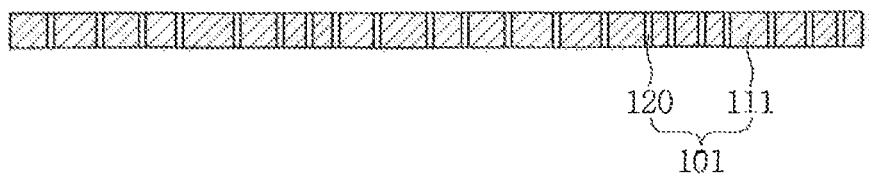

Exemplary embodiments of the present inventive concept will now be described more fully hereinafter with reference to the accompanying drawings. However, it is to be understood that various modifications may be made.

In the drawings, certain elements or shapes may be illustrated in an enlarged manner or in a simplified manner to better illustrate the invention, and other elements present in an actual product may be omitted.

When a layer, area, or plate is referred to as being "on" another layer, area, or plate, it may be directly on the other layer, area, or plate, or intervening layers, areas, or plates may be present therebetween. Further when a layer, area, or plate is referred to as being "below" another layer, area, or plate, it may be directly below the other layer, area, or plate, or intervening layers, areas, or plates may be present therebetween.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" can be termed likewise without departing from the teachings herein.

FIG. 1 is a manufacturing diagram illustrating a light scattering film according to an exemplary embodiment of the present invention.

A method of manufacturing the light scattering film according to an exemplary embodiment of the present invention includes a process "Pr. 1" for preparing a light transmissive base 111 having a film shape, and a process "Pr. 2" for defining a plurality of holes 120 in the light transmissive base 111, using a perforated sheet manufacturing device 501. Each of the holes 120 has a diameter ranging from about 100 nm to about 5 µm, and the size of a gap among the holes 120 is about twice to about five times that of an average diameter of the holes 120.

The light transmissive base 111, having a film shape, may include a light transmissive resin having light transmitting characteristics. Various methods for manufacturing the light transmissive base 111 may be used. The light transmissive base 111 may be manufactured through methods of manufacturing a high molecular weight film known in the pertinent art.

The light transmissive base 111 may include a polyimide (PI)-based resin, a polyethylene terephthalate (PET)-based resin, a polyester (PE)-based resin, a polystyrene (PS)-based resin, an acrylic resin, a polycarbonate (PC)-based resin, and/or a cycloolefin polymer (COP), for example.

The light transmissive base 111 may have a thickness ranging from about 20 µm to about 200 µm. In a case where the light transmissive base 111 has a thickness of about 20 µm or more, the light scattering film 101 may have stable mechanical characteristics and heat resistance. In addition, in a case where the light transmissive base 111 has a thickness of about 200 µm or less, the light scattering film 101 may be flexible, and a display device including the light scattering film 101 may be relatively thin.

Referring to FIG. 1, the perforated sheet manufacturing device 501 includes a punching plate 510 and a plurality of microneedles 511 disposed on the punching plate 510. The microneedle 511 each have a diameter ranging from about 100 nm to about 5 µm. In addition, the microneedles 511 each have a greater length than a thickness of the light transmissive base 111. For example, the microneedles 511 may each have a length ranging from about 20 µm to about 300 µm.

The process "Pr. 2" of defining the plurality of holes 120 may be performed two or more times. As the process "Pr. 2" of defining the plurality of holes 120 is performed two or more times, the holes 120 may be densely defined within the light transmissive base 111. In consideration of the density of the holes 120, the number of performing the process "Pr. 2" that may be performed in defining the plurality of holes 120 may be adjusted.

The plurality of holes 120 may have a density ranging from about $1 \times 10^7/cm^2$ to about $5 \times 10^8/cm^2$. The density of the plurality of holes 120 may vary based on a purpose of use of the light scattering film being manufactured.

Figure 2:
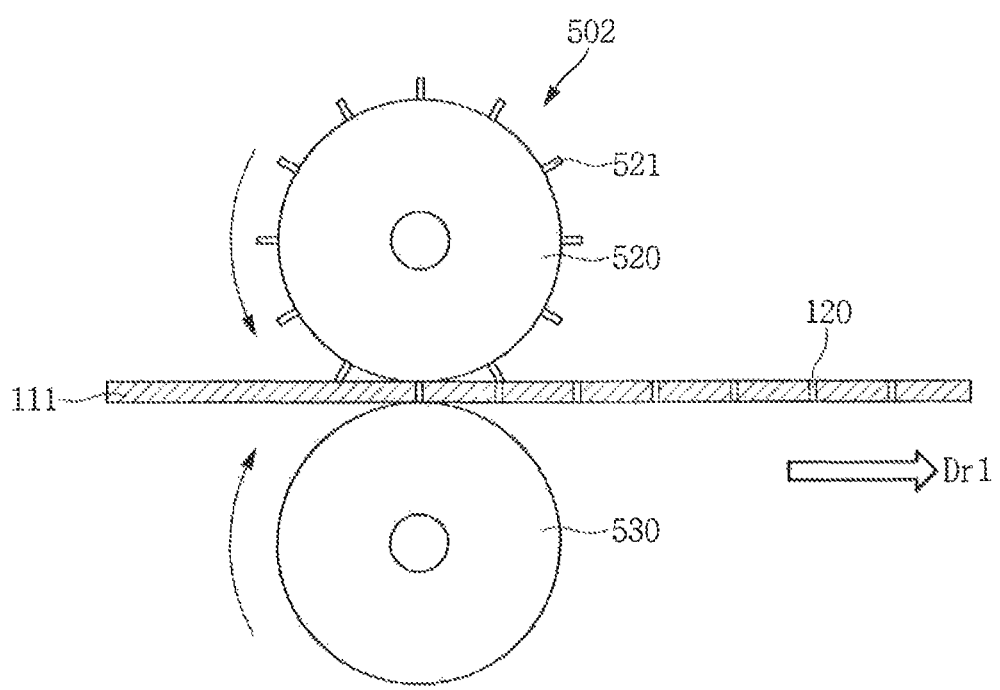
FIG. 2 is a manufacturing diagram illustrating a light scattering film according to an exemplary embodiment of the present inventive concept.

FIG. 2 is a diagram illustrating the manufacturing of a light scattering film according to an exemplary embodiment of the present invention.

A perforated sheet manufacturing device 502 according to an exemplary embodiment of the present invention includes a punching roller 520 and a plurality of microneedles 521 disposed on the punching roller 520. Each of the microneedles 521 has a diameter ranging from about 100 nm to about 5 µm.

When the punching roller 520 is rotated, the light transmissive base 111 is perforated by the plurality of microneedles 521 on the punching roller 520 such that a plurality of holes 120 are defined in the light transmissive base 111.

In addition, the perforated sheet manufacturing device 502, according to an exemplary embodiment of the present invention, further includes a transfer roller 530 opposing the punching roller 520. The light transmissive base 111 is disposed between the punching roller 520 and the transfer roller 530, and when the light transmissive base 111 is transferred/rolled between the punching roller 520 and the transfer roller 530, the plurality of holes 120 is defined in the light transmissive base 111. In FIG. 2, the punching roller 520 is rotated in a counterclockwise direction and the transfer roller 530 is rotated in a clockwise direction, such that the light transmissive base 111 is transferred in the right direction "Dr 1" of the drawing.

Figure 3A:
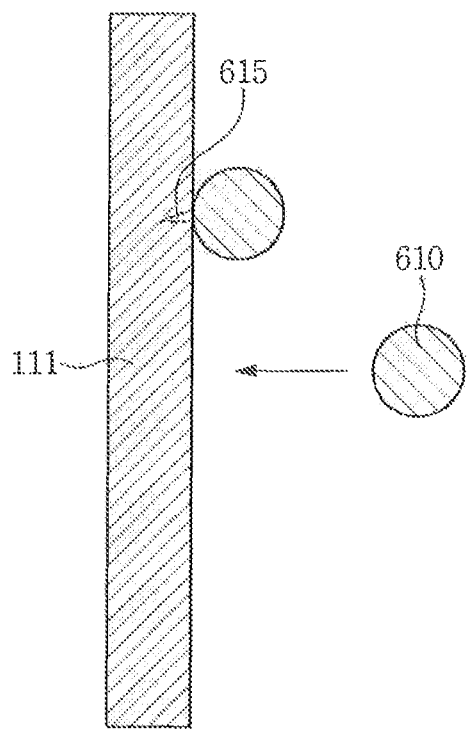
FIGS. 3A and 3B are manufacturing diagrams illustrating a light scattering film according to an exemplary embodiment of the present inventive concept.
Figure 3B:
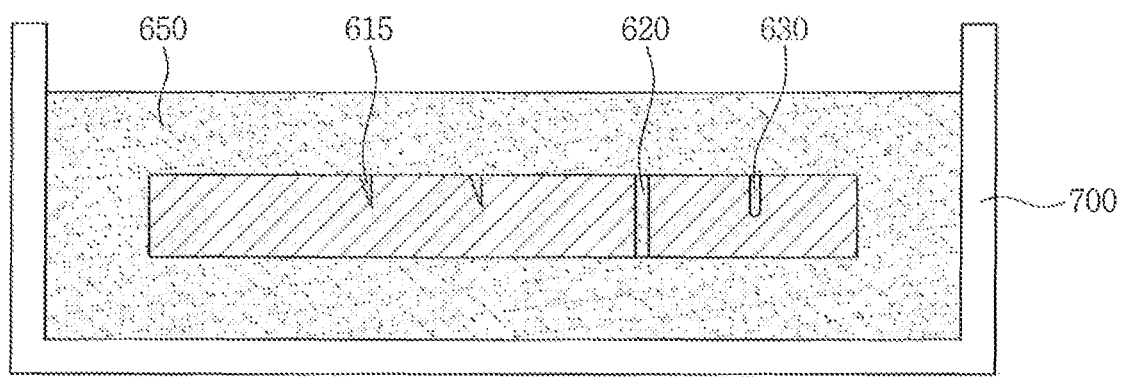

FIGS. 3A and 3B are manufacturing diagrams illustrating a light scattering film according to an exemplary embodiment of the present invention.

A method of manufacturing the light scattering film according to an exemplary embodiment of the present invention includes a process of preparing a light transmissive base 111 having a film shape by smashing a bead 610 to the light transmissive base 111 to cause a crack 615 on a surface of the light transmissive base 111. Thereafter, the light transmissive base 111 having the cracks 615 may be selectively etched, using an etching solution 650.

The bead 610 may include an acrylic resin, a polystyrene (PS) resin, a polyvinyl chloride resin, a polycarbonate (PC) resin, a polyethylene terephthalate (PET) resin, a polyethylene (PE) resin, a polypropylene (PP) resin, a polyimide (PI) resin, glass, silica, and/or steel.

The number and size of the cracks 615 caused in the light transmissive base 111 may vary based on the speed of the bead 610 colliding with the light transmissive base 111 and the composition of the light transmissive base 111. The number and size of the cracks 615 may vary as desired.

The etching solution 650 may include sulfuric acid ($H_2SO_4$), hydrofluoric acid (HF), and/or hydrochloric acid (HCl), for example. The composition of the etching solution 650 may vary based on the composition of the light transmissive base 111.

A plurality of holes 620 are defined in the light transmissive base 111 through etching using the etching solution 650. Each of the holes 620 defined in such a manner has a diameter ranging from about 100 nm to about 5 µm. In addition, the length of a gap among the holes 620 may be about twice to about five times as large as an average diameter of the holes 620.

According to an exemplary embodiment of the present invention, a plurality of recessed portions 630 may be defined in the light transmissive base 111 through etching using the etching solution 650. The recessed portion has a depth that is less than a thickness of the light transmissive base 111 and may have a diameter ranging from about 100 nm to about 5 μm.

Referring to FIG. 3B, the light transmissive base 111 having the crack 615 is immersed in the etching solution 650 which is put in a container 700 so that the light transmissive base 111 may be etched in a selective manner through the crack 615. However, the invention is not limited thereto, and the etching solution 650 may be dispersed in the light transmissive base 111 having the crack 615 such that the light transmissive base 111 may be etched in a selective manner through the crack 615.

According to an exemplary embodiment of the present invention, a hard coating layer may be disposed on the light transmissive base 111. A crack may occur in the hard coating layer through collision with the bead 610. Accordingly, the etching solution permeates into the light transmissive base 111 through the crack caused in the hard coating layer such that the light transmissive base 111 may be etched in a selective manner.

Hereinafter, light scattering films 101, 102, and 103 according to exemplary embodiments of the present invention will be described with reference to FIGS. 4A, 4B, 5, and 6, respectively.

The light scattering films 101, 102, and 103 according to exemplary embodiments of the present invention, may be manufactured according to one of the methods described herein.

Figure 4A:
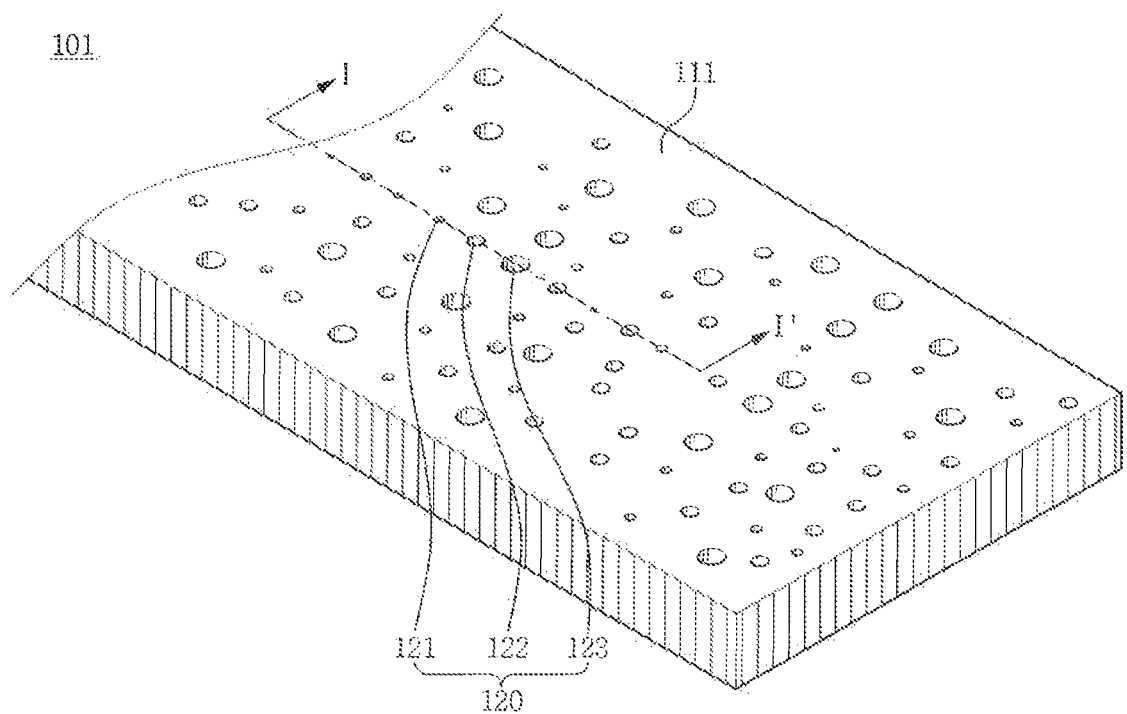
FIG. 4A is a perspective view illustrating a light scattering film according to an exemplary embodiment of the present inventive concept.
Figure 4B:
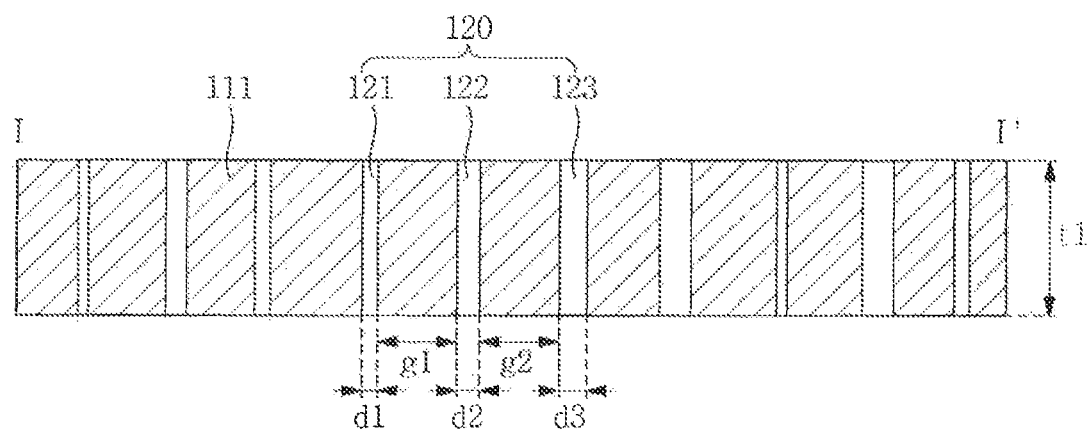
FIG. 4B is a cross-sectional view taken along line I-I' of FIG. 4A.

FIG. 4A is a perspective view of the light scattering film 101 according to an exemplary embodiment of the present invention, and FIG. 4B is a cross-sectional view taken along line I-I' of FIG. 4A.

The light scattering film 101, according to an exemplary embodiment of the present invention, includes a light transmissive base 111 defined with a plurality of holes 120. Each of the holes 120 has a diameter ranging from about 100 nm to about 5 μm, and a gap among the holes 120 (e.g. a space between the holes) is about twice to about five times of an average diameter of the holes 120.

The light scattering film 101, according to an exemplary embodiment of the present invention, may further include a protection film or a hard coating layer disposed on the light transmissive base 111.

The light transmissive base 111 may have a refractive index ranging from about 1.4 to about 2.2. The hole 120 may be filled with a gas, e.g., an air, and the gas may have a refractive index ranging from about 1.0 to about 1.3. Due to such a refractive-index difference between the gas and the light transmissive base 111, a light path and a degree of light diffusion may change at a side wall of the hole 120, and thus light transmitted through the light transmissive base 111 may be scattered.

Due to the light scattering, a collimated light and a diffused light transmitted through the light scattering film 101 may be efficiently mixed, and luminance distribution of side light, a light emitted toward a side surface of a display device, may change. Accordingly, a difference between front visibility and side visibility is reduced in a display device including the light scattering film 101 illustrated in FIGS. 4A and 4B, and the side visibility may be increased. In addition, color shift of the side light emitted from the display device including the light scattering film 101, e.g., white angular dependency (WAD) of a white color, may be reduced.

In an exemplary embodiment of the present invention, light scattering characteristics and a haze value of the light scattering film 101 may be adjusted by adjusting the refractive index of the light transmissive base 111, the diameter of the hole 120, the gap of the holes 120, and/or the shape of the hole 120.

The hole 120 defined in the light transmissive base 111 may include a first hole 121 having a first diameter $d1$, a second hole 122 having a second diameter $d2$, and a third hole 123 having a third diameter $d3$, for example. The respective diameters $d1$, $d2$, and $d3$ of the holes 121, 122, and 123 may be the same as or different from one another. In addition, gaps $g1$ and $g2$ among respective ones of the holes 121, 122, and 123 may be the same as or different from one another.

Figure 5:
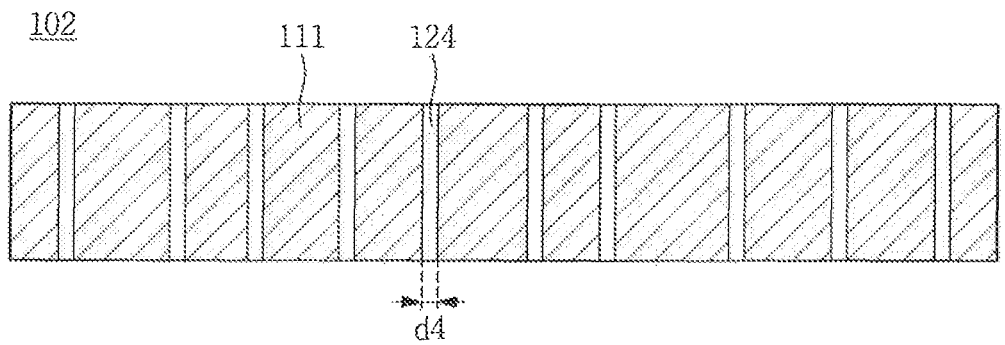
FIG. 5 is a cross-sectional view illustrating a light scattering film according to an exemplary embodiment of the present inventive concept.

FIG. 5 is a cross-sectional view of a light scattering film 102 according to an exemplary embodiment of the present invention. Referring to FIG. 5, diameters $d4$ of holes 124 defined in a light transmissive base 111 are the same as one another. For example, all holes 124 may have the same diameter. However, gaps among adjacent ones of the holes 124 may be the same as or different from one another.

Due to the hole 124 defined in such a manner, the light scattering film 102 may induce irregular light scattering. Due to the irregular light scattering, light scattering efficiency may be increased.

Figure 6:
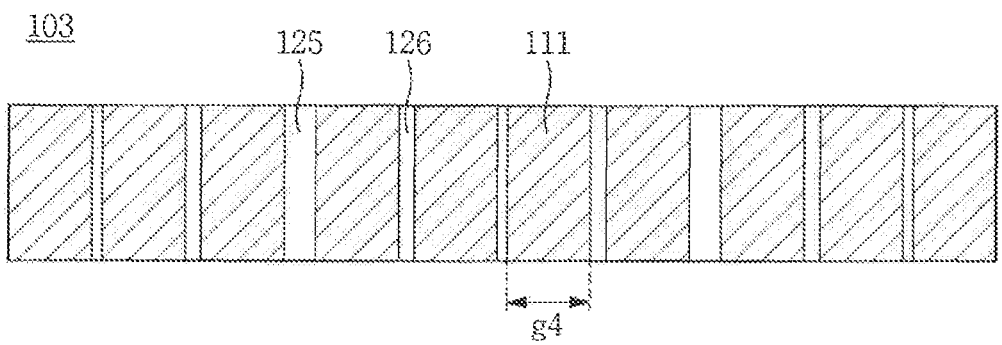
FIG. 6 is a cross-sectional view illustrating a light scattering film according to an exemplary embodiment of the present inventive concept.

FIG. 6 is a cross-sectional view of a light scattering film 103 according to an exemplary embodiment of the present invention. Referring to FIG. 6, diameters of holes 125 and 126 defined in a light transmissive base 111 may be the same as or different from one another. However, gaps $g4$ between proximate holes 125 and 126 are the same as one another.

Due to the holes 125 and 126 having different diameters, the light scattering film 103 may induce irregular light scattering. Due to the irregular light scattering, luminance distribution of side light may change and a collimated light and a diffused light transmitted through the light scattering film 103 may be efficiently mixed.

Hereinafter, an exemplary embodiment of the present invention will be described with reference to FIG. 7.

Figure 7:
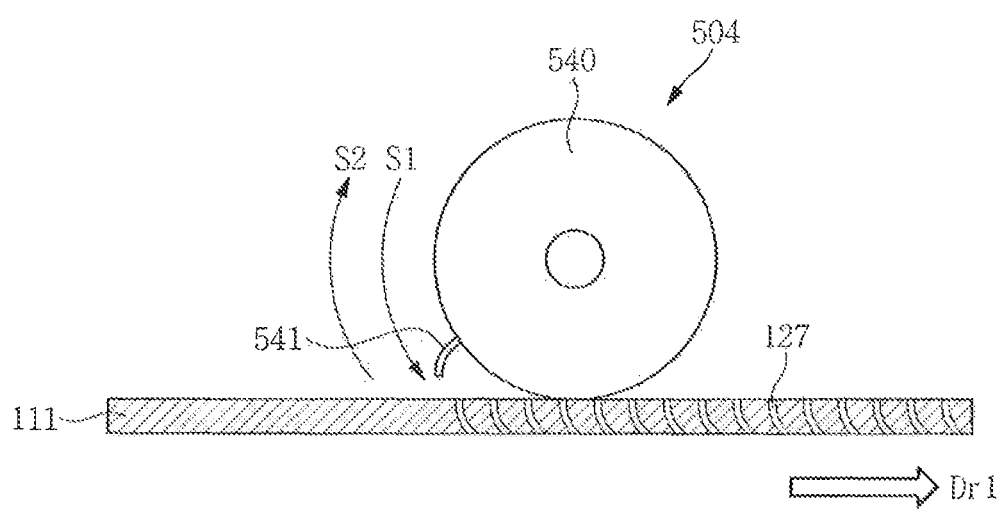
FIG. 7 is a manufacturing diagram illustrating a light scattering film according to an exemplary embodiment of the present inventive concept.

FIG. 7 is a manufacturing diagram of the light scattering film according to an exemplary embodiment of the present invention.

According to an exemplary embodiment of the present invention, a hole 127 having a curved portion is defined in a light transmissive base 111 by a perforated sheet manufacturing device 504.

For example, the perforated sheet manufacturing device 504 may include a punching roller 540 and one or more microneedles 541 disposed on the punching roller 540. The microneedle 541 may have a curved portion.

When the punching roller 540 is rotated in a direction S1 of FIG. 7, the microneedle 541 perforates the light transmissive base 111, and when the punching roller 540 is rotated in a direction S2, the microneedle 541 deviates away from the light transmissive base 111 such that the plurality of holes 127 having a curved portion are defined in the light transmissive base 111. In such an exemplary embodiment, the light transmissive base 111 moves toward the right direction "Dr 1" of the drawings.

Figure 8:
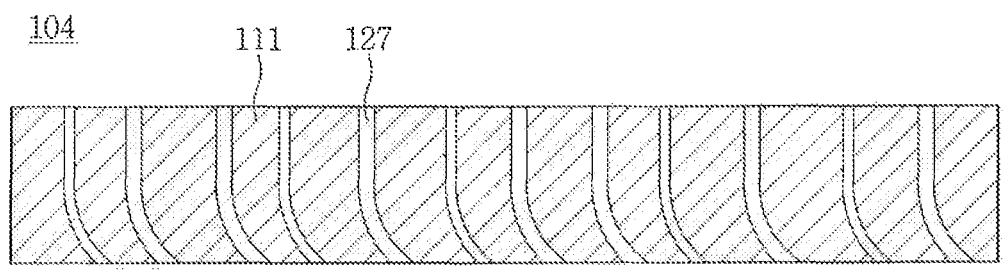
FIG. 8 is a cross-sectional view illustrating a light scattering film according to an exemplary embodiment of the present inventive concept.

FIG. 8 is a cross-sectional view of a light scattering film 104 according to an exemplary embodiment of the present invention. A hole 127 defined in a light transmissive base 111 has a curved portion along a thickness direction of the light transmissive base 111. Referring to FIG. 8, the hole 127 defined in the light transmissive base 111 has the curved portion in a lower portion of the drawings.

When the hole 127 has such a curved portion, a light (front light) which propagates from the front to the rear of the light scattering film 104 is more likely to pass through the curved portion of the hole 127, and accordingly, light scattering efficiency of the front light may be increased.

Hereinafter, an exemplary embodiment of the present invention will be described with reference to FIG. 9.

Figure 9:
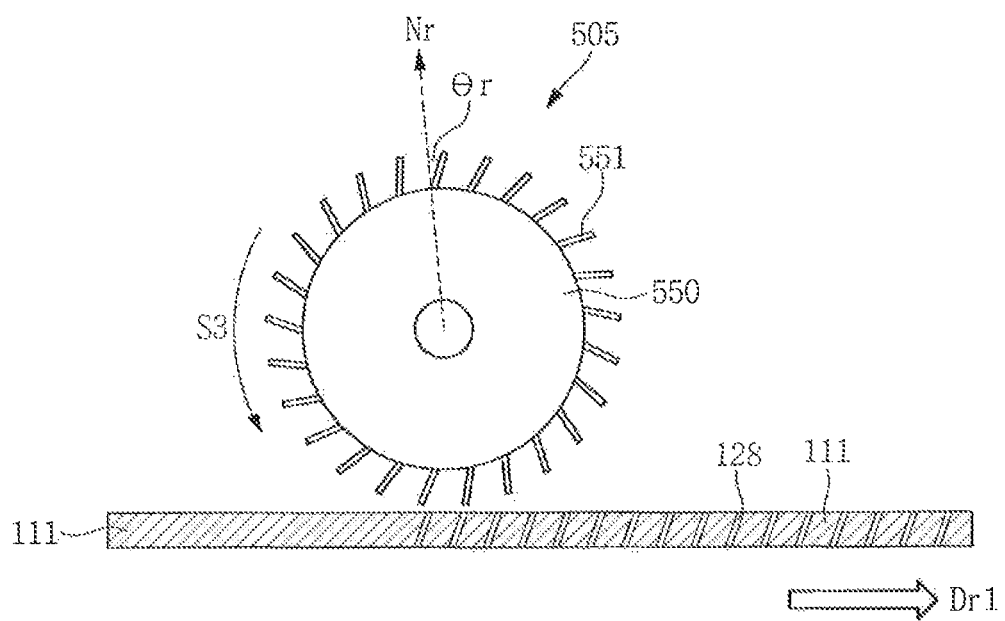
FIG. 9 is a manufacturing diagram illustrating a light scattering film according to an exemplary embodiment of the present inventive concept.

FIG. 9 is a manufacturing diagram illustrating a light scattering film according to an exemplary embodiment of the present invention.

According to an exemplary embodiment of the present invention, a hole 128 having inclination is defined in a light transmissive base 111, using a perforated sheet manufacturing device 505.

For example, the perforated sheet manufacturing device 505, according to an exemplary embodiment of the present invention, includes a punching roller 550 and a plurality of microneedles 551 disposed on the punching roller 550. Each microneedle 551 has an inclination angle $\theta r$ with respect to a normal line Nr of a surface of the punching roller 550. For example, the inclination angle $\theta r$ may be in a range of about 20° to about 40°.

As the punching roller 540 is rotated in a direction S3 of FIG. 9, the microneedle 551 perforates the light transmissive base 111 and the light transmissive base 111 moves toward the right direction of the drawing.

Figure 10:
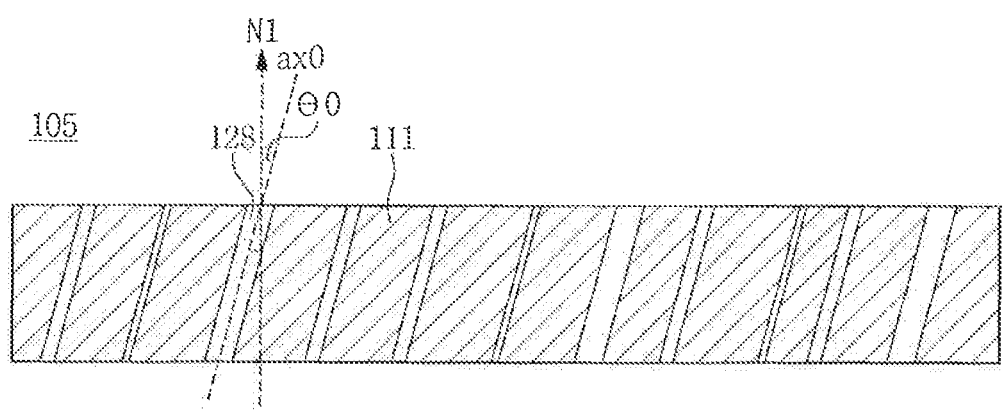
FIG. 10 is a cross-sectional view illustrating a light scattering film an exemplary embodiment of the present inventive concept.

FIG. 10 is a cross-sectional view illustrating a light scattering film 104 according to an exemplary embodiment of the present invention. A hole 128 defined in a light transmissive base 111 is inclined with respect to a surface of the light transmissive base 111. For example, a central axis ax0 of the hole 128 defined in the light transmissive base 111 has an inclination angle $\theta 0$ with respect to a normal line N1 of the light transmissive base 111. Herein, the normal line N1 of the light transmissive base 111 is a straight line that is perpendicular to the surface of the light transmissive base 111, and the inclination angle $\theta 0$ of the hole 128 is an angle between the central axis ax0 of the hole 128 and the normal line N1 of the light transmissive base 111. For example, the inclination angle $\theta 0$ may be in a range of about 20° to about 40°.

As the hole 128 is inclined, a light (front light) which propagates from the front to the rear of the light scattering film 105 is more likely to pass through the hole 128, and accordingly, light scattering efficiency of the front light may be increased.

Figure 11:
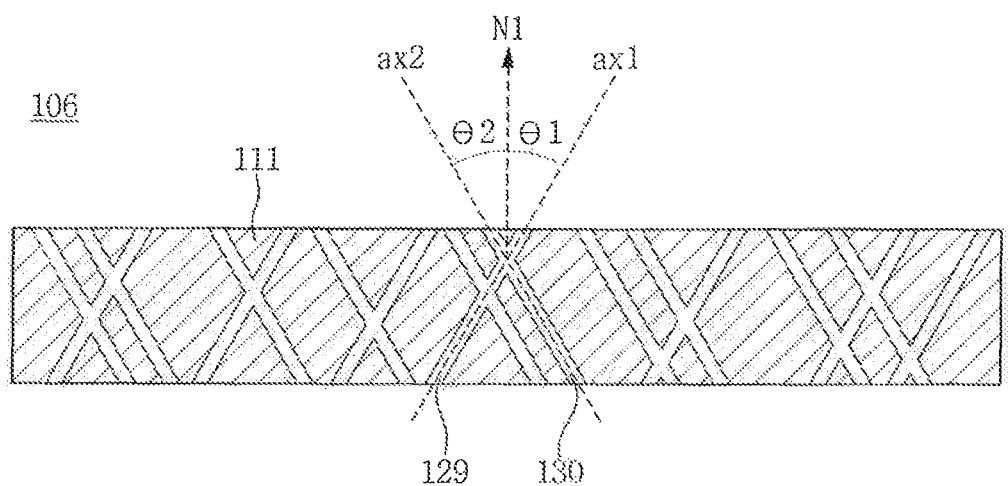
FIG. 11 is a cross-sectional view illustrating a light scattering film according to an exemplary embodiment of the present inventive concept.

FIG. 11 is a cross-sectional view of a light scattering film 106 according to an exemplary embodiment of the present invention. Holes 129 and 130 defined in a light transmissive base 111 are inclined with respect to a normal line N1 of the light transmissive base 111. Hereinafter, the holes 129 and 130 each having different inclination angles are to be referred to as a first inclined hole 129 and a second inclined hole 130, respectively.

For example, the first inclined hole 129 is defined in the light transmissive base 111 by the perforated sheet manufacturing device 505 according to an exemplary embodiment of the present invention, and then the light transmissive base 111 is again put into the perforated sheet manufacturing device 505 in a reverse direction such that the second inclined hole 130 may be defined in the light transmissive base 111.

The first inclined hole 129 has a first inclination angle $\theta 1$ with respect to the normal line N1 of the light transmissive base 111. For example, a central axis ax1 of the first inclined hole 129 has the first inclination angle $\theta 1$ with respect to the normal line N1 of the light transmissive base 111.

The second inclined hole 130 has a second inclination angle $\theta 2$ with respect to the normal line N1 of the light transmissive base 111. Referring to FIG. 11, the first inclined hole 129 and the second inclined hole 130 may intersect each other. For example, a central axis ax2 of the second inclined hole 130 has a second inclination angle $\theta 2$ with respect to the normal line N1 of the light transmissive base 111.

As such, as the light transmissive base 111 has the first inclined hole 129 and the second inclined hole 130, light scattering efficiency of a light (e.g. a front light) which propagates from the front to the rear of the light scattering film 106 may increase.

Figure 12:
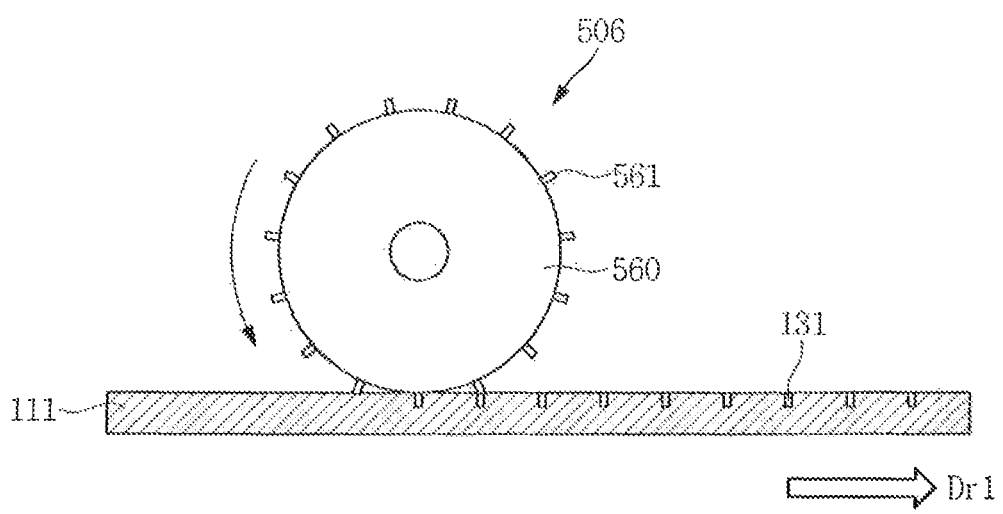
FIG. 12 is a manufacturing diagram illustrating a light scattering film according to an exemplary embodiment of the present inventive concept.

FIG. 12 is a manufacturing diagram illustrating a light scattering film according to an exemplary embodiment of the present invention.

A method of manufacturing the light scattering film according to an exemplary embodiment of the present invention includes a process of preparing a light transmissive base 111 having a film shape and a process of defining a plurality of recessed portions 131 in the light transmissive base 111, using a perforated sheet manufacturing device 506. Each of the recessed portions 131 is less deep than a thickness of the light transmissive base 111 and each recessed portion 131 has a diameter ranging from about 100 nm to about 5 μm. In addition, a gap among the recessed portions 131 is about twice to about five times as large as an average diameter of the recessed portions 131.

The process of defining the plurality of recessed portions 131 may be performed two or more times. As the process of defining the plurality of recessed portions 131 is performed two or more times, the recessed portions 131 may be densely defined in the light transmissive base 111. The plurality of recessed portions 131 may have a density ranging from about $1 \times 10^7/\text{cm}^2$ to about $5 \times 10^8/\text{cm}^2$. The density of the plurality of recessed portions 131 may vary based on a purpose of use of the light scattering film.

Referring to FIG. 12, the perforated sheet manufacturing device 506 includes a first punching roller 560 and a plurality of microneedles 561 disposed on the first punching roller 560. Each microneedle 561 has a length that is smaller than the thickness of the light transmissive base 111 and each microneedle 561 has a diameter ranging from about 100 nm to about 5 μm.

The perforated sheet manufacturing device 506 may further include a transfer roller opposing the first punching roller 560. The light transmissive base 111 may be transferred in the right direction "Dr 1" of the drawing by the first punching roller 560 and the transfer roller.

Figure 13:
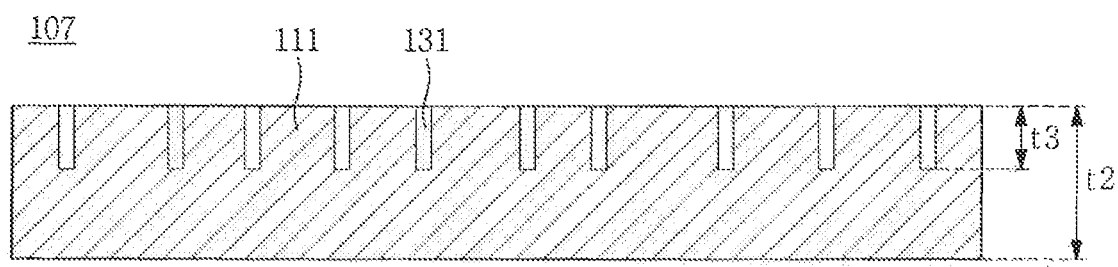
FIG. 13 is a cross-sectional view illustrating a light scattering film according to an exemplary embodiment of the present inventive concept.

FIG. 13 is a cross-sectional view illustrating a light scattering film 107 according to an exemplary embodiment of the present invention.

The light scattering film 107 may include a light transmissive base 111 having a plurality of recessed portions 131. The recessed portion 131 has a less depth t3 than a thickness t2 of the light transmissive base 111. The recessed portion 131 is filled with a gas, e.g., an air, and due to a refractive-index difference between the gas and the light transmissive base 111, a light transmitted through the light scattering film 107 may be scattered.

Figure 14:
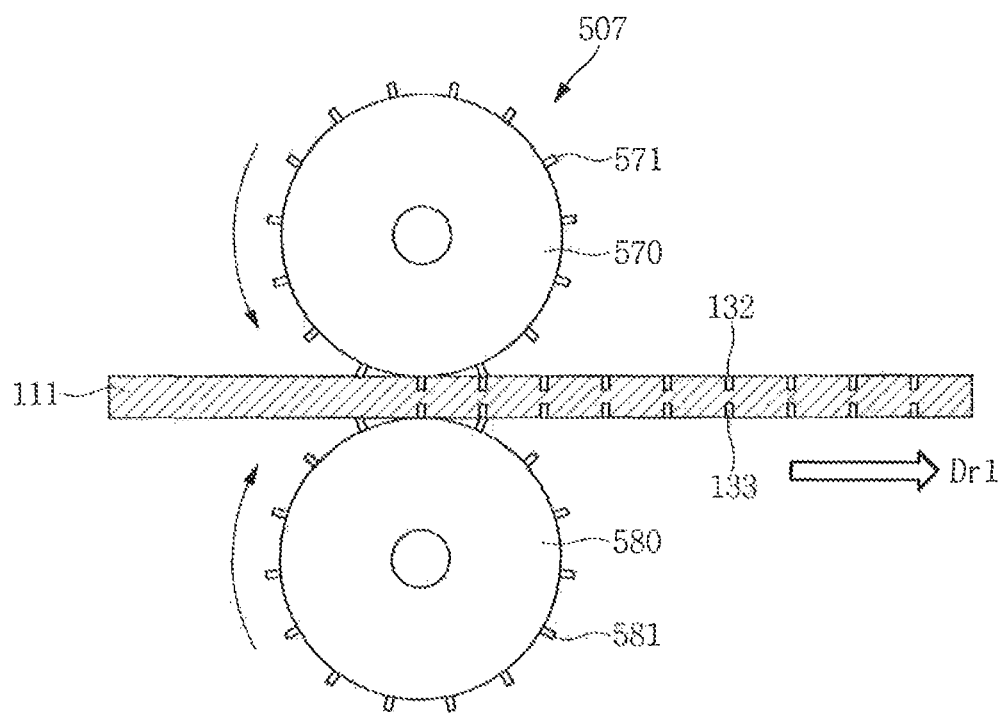
FIG. 14 is a manufacturing diagram illustrating a light scattering film according to an exemplary embodiment of the present inventive concept.

FIG. 14 is a manufacturing diagram illustrating a light scattering film according to an exemplary embodiment of the present invention.

Referring to FIG. 14, a perforated sheet manufacturing device 507 may include a first punching roller 570 and a plurality of microneedles 571 disposed on the first punching roller 570, and may further include a second punching roller 580 opposing the first punching roller 570. A plurality of microneedles 581 may be disposed on the second punching roller 580. When a light transmissive base 111 is transferred between the first punching roller 570 and the second punching roller 580, recessed portions 132 and 133 are defined in opposite surfaces of the light transmissive base 111.

In addition, the first punching roller 570 and the second punching roller 580 may be used to transfer the light transmissive base 111 in the right direction "Dr 1" of the drawing.

Figure 15:
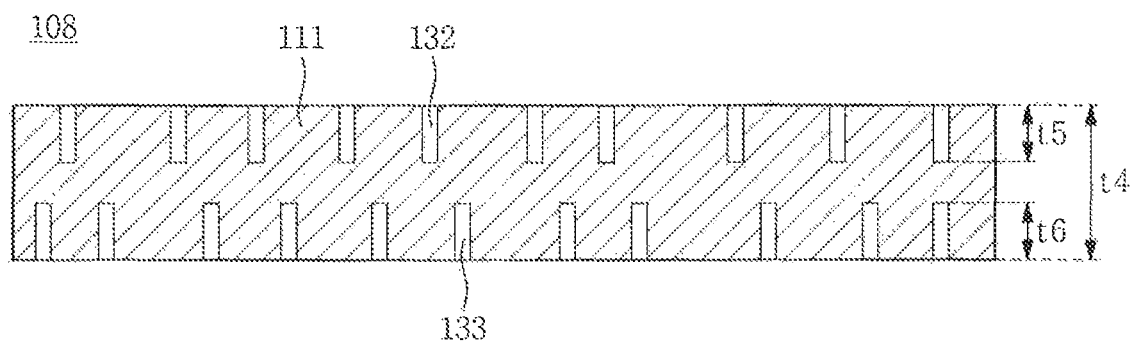
FIG. 15 is a cross-sectional view illustrating a light scattering film an exemplary embodiment of the present inventive concept.

FIG. 15 is a cross-sectional view illustrating a light scattering film 108 according to an exemplary embodiment of the present direction.

A light transmissive base 111 has a plurality of first recessed portions 132 defined in a first surface. In FIG. 15, the first surface of the light transmissive base 111 corresponds to an upper surface of the light transmissive base 111, and a second surface of the light transmissive base 111 corresponds to a lower surface of the light transmissive base 111.

The first recessed portion 132 has a depth t5 that is smaller than a thickness t4 of the light transmissive base 111, and the first recessed portion 132 has a diameter ranging from about 100 nm to about 5 μm.

The light transmissive base 111, according to an exemplary embodiment of the present invention, has a plurality of second recessed portions 133 defined in the second surface. The second recessed portion 133 has a depth t6 that is smaller than the thickness t4 of the light transmissive base 111, and the second recessed portion 133 has a diameter ranging from about 100 nm to about 5 μm.

According to an exemplary embodiment of the present invention, a total (t5+t6) of the depth t5 of the first recessed portion 132 and the depth t6 of the second recessed portion 133 is less than the thickness t4 of the light transmissive base 111.

Hereinafter, an exemplary embodiment of the present invention will be described with reference to FIG. 16.

Figure 16:
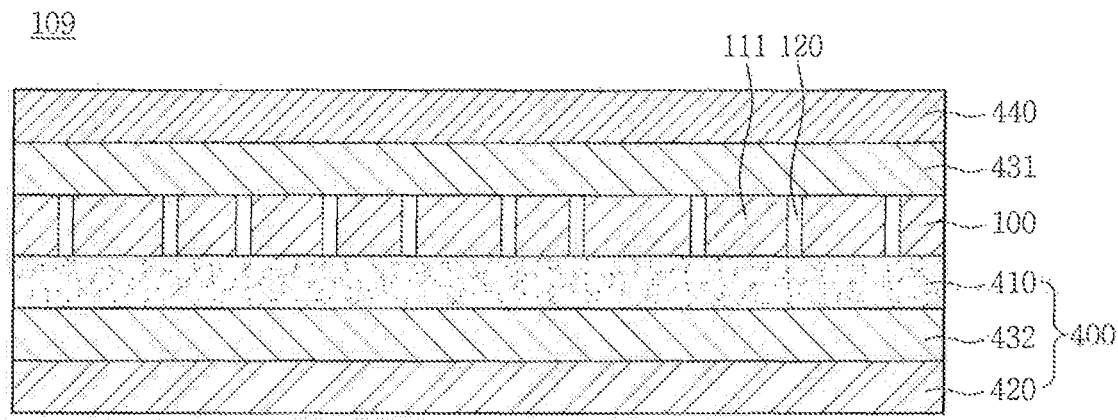
FIG. 16 is a cross-sectional view illustrating a polarization film according to an exemplary embodiment of the present inventive concept.

FIG. 16 is a cross-sectional view illustrating a polarization film 109 according to an exemplary embodiment of the present disclosure.

The polarization film 109 may include a polarizer 400 and a light scattering film 100 disposed on the polarizer 400. The polarizer 400 includes a linear polarizer 410 and a retardation plate 420 disposed on the linear polarizer 410.

The light scattering film 100 may use one of the light scattering films 101, 102, 103, 104, 105, 106, 107, and 108 described above.

According to an exemplary embodiment of the present invention, the light scattering film 100 may include a light transmissive base 111 having, for example, a plurality of holes 120. However, the invention is not limited thereto, and the light scattering film 100 may include a light transmissive base 111 having a plurality of recessed portions.

The polarization film 109, according to an exemplary embodiment of the present invention, may include first and second supporting members 431 and 432. The first and second supporting members 431 and 432 may include a triacetylcellulose (TAC) film.

The disposition of the first and second supporting members 431 and 432 may be different from the arrangement illustrated. For example, referring to FIG. 16, the first supporting member 431 may be disposed on the light scattering film 100, and the second supporting member 432 may be disposed between the linear polarizer 410 and the retardation plate 420. The first and second supporting members 431 and 432 may be omitted. A supporting member may be disposed between the light scattering film 100 and the linear polarizer 410.

A hard coating layer 440 is disposed on the first supporting member 431. The hard coating layer 440 protects the polarizer 400 and the light scattering film 100.

The linear polarizer 410 linearly polarizes external light incident to the light scattering film 100.

The linear polarizer 410 may use a film that is formed by orienting dichroic dyes on a polyvinyl alcohol (PVA) resin in an absorption manner. However, the linear polarizer 410 is not limited thereto.

The retardation plate 420 is disposed on a surface of the linear polarizer 410. When the polarization film 109 is attached to a display panel, the retardation plate 420 may be disposed more adjacent to the display panel than the linear polarizer 410 is thereto.

The retardation plate 420 retards the phase of light. The retardation plate 420 may convert linearly polarized light into circularly polarized light, or may convert circularly polarized light into linearly polarized light. For example, light incident to the polarization film 109 from an external source may be linearly polarized by the linear polarizer 410 and circularly polarized by the retardation plate 420. The circularly-polarized external light is reflected in the display panel, thus changed in terms of a phase direction, and fails to propagate through the polarization film 109 to be dissipated.

The retardation plate 420 according to an exemplary embodiment of the present invention may include a quarter wave plate ("QWP").

The retardation plate 420 may further include a half wave plate ("HWP") in addition to the QWP.

In general, the QWP is designed to be most suitable to phase-shift an external light incident from the front, e.g., an external light that is incident perpendicularly to a surface of the polarization film 109. Accordingly, when only the QWP is used as the retardation plate 420, an external light incident to a liquid crystal display ("LCD") device at a predetermined inclination angle might not be desirably phase-shifted. For example, a light path of an external light may vary based on an incident angle of the external light, and thus phase retardation effects may vary based on the incident angle of the external light. In order to avoid such varying phase retardation effects, the HWP may further be used in addition to the QWP.

Hereinafter, a display device according an exemplary embodiment of the present invention will be described with reference to FIGS. 17 and 18.

Figure 17:
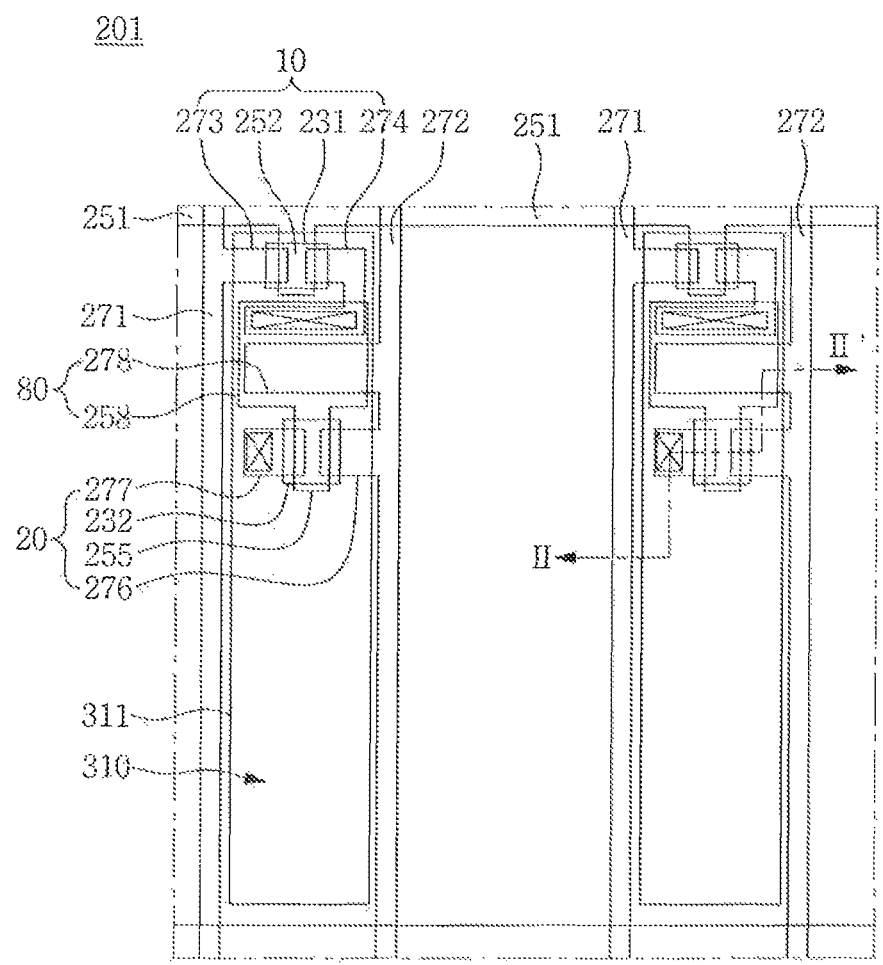
FIG. 17 is a planar configuration view illustrating a display device according to an exemplary embodiment of the present inventive concept.
Figure 18:
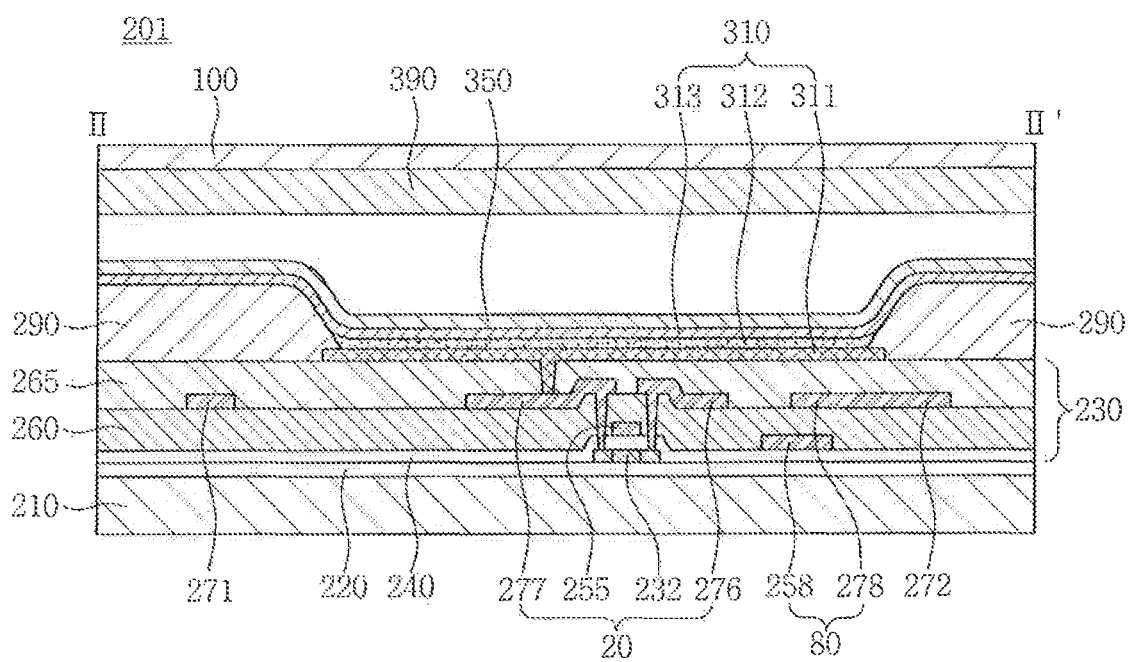
FIG. 18 is a cross-sectional view taken along line II-II' of FIG. 17.

FIG. 17 is a planar configuration view of a display device according to an exemplary embodiment of the present invention, and FIG. 18 is a cross-sectional view taken along line II-II' of FIG. 17. The display device according to an exemplary embodiment of the present invention may be an organic light emitting diode ("OLED") display device 201.

As illustrated in FIGS. 17 and 18, the OLED display device 201 may include a substrate 210, a driving circuit unit 230, an OLED 310, a protection layer 350, a window 390, and a light scattering film 100.

The substrate 210 may include an insulating material such as glass, quartz, ceramic, plastic, and/or the like. However, the invention is not limited thereto, and the substrate 210 may include a metal material such as stainless steel.

A buffer layer 220 is disposed on the substrate 210. The buffer layer 220 may include at least one organic and/or inorganic layer. The buffer layer 220 may be omitted.

The driving circuit unit 230 is disposed on the buffer layer 220. The driving circuit unit 230 includes a plurality of thin film transistors (TFTs) 10 and 20 and drives the OLED 310. For example, the OLED 310 emits light based on a driving signal applied from the driving circuit unit 230, thereby displaying images.

FIGS. 17 and 18 illustrate an active matrix-type organic light emitting diode (AMOLED) display device 201 having a 2Tr-1Cap structure according to an exemplary embodiment of the present invention. For example, the 2Tr-1Cap structure may include two TFTs, e.g., a switching TFT 10 and a driving TFT 20, and one capacitor 80 in each pixel, but the invention is not limited thereto. For example, the OLED display device 201 may include three or more TFTs and two or more capacitors in each pixel, and may further include additional wirings. Herein, the term "pixel" refers to a smallest unit for displaying an image, and the OLED display device 201 displays an image using a plurality of pixels.

Each pixel includes the switching TFT 10, the driving TFT 20, the capacitor 80, and the OLED 310. Configurations of the switching TFT 10, the driving TFT 20, and the capacitor 80 are collectively referred to as the driving circuit unit 230. In addition, a gate line 231 extending along a direction, and a data line 271 and a common power line 272 insulated from and intersecting the gate line 251 are disposed in the driving circuit unit 230. Each pixel may be defined by the gate line 251, the data line 271, and the common power line 272 as a boundary, but the invention is not limited thereto. The pixels may be defined by a pixel defining layer or a black matrix.

The OLED 310 includes a first electrode 311, a light emitting layer 312 on the first electrode 311, and a second electrode 313 on the light emitting layer 312. The light emitting layer 312 may include a low molecular weight organic layer or a high molecular weight organic layer. Holes and electrons are applied from the first electrode 311 and the second electrode 313, respectively, into the light emitting layer 312 and then combined with each other therein to form an exciton. The OLED 310 may emit light by energy generated when the exciton falls from an excited state to a ground state.

The capacitor 80 includes a pair of capacitor plates 258 and 278, having an insulating interlayer 260 interposed therebetween. In such an exemplary embodiment, the insulating interlayer 260 may be a dielectric element. A capacitance of the capacitor 80 is determined by electric charges accumulated in the capacitor 80 and a voltage across the pair of capacitor plates 258 and 278.

The switching TFT 10 includes a switching semiconductor layer 231, a switching gate electrode 252, a switching source electrode 273, and a switching drain electrode 274. The driving TFT 20 includes a driving semiconductor layer 232, a driving gate electrode 255, a driving source electrode 276, and a driving drain electrode 277. A gate insulating layer 240 is further provided to insulate the semiconductor layers 231 and 232 and the gate electrodes 252 and 255.

The switching TFT 10 may function as a switching element which selects a pixel to perform light emission. The switching gate electrode 252 is connected to the gate line 251, and the switching source electrode 273 is connected to the data line 271. The switching drain electrode 274 is spaced apart from the switching source electrode 273 and connected to one of the capacitor plates, e.g., the capacitor plate 258.

The driving TFT 20 applies a driving power, which allows the light emitting layer 312 of the OLED 310 in a selected pixel to emit light, to the first electrode 311, which is a pixel electrode. The driving gate electrode 255 is connected to the capacitor plate 258 that is connected to the switching drain electrode 274. Each of the driving source electrode 276 and the other of the capacitor plates, e.g., the capacitor plate 278, is connected to the common power line 272. The driving drain electrode 277 is connected to the first electrode 311 of the OLED 310 through a contact hole defined in a planarization layer 265.

The switching TFT 10 is operated based on a gate voltage applied to the gate line 251 and serves to transmit a data voltage applied to the data line 271 to the driving TFT 20. A voltage equivalent to a difference between a common voltage applied to the driving TFT 20 from the common power line 272 and the data voltage transmitted by (or from) the switching TFT 10 is stored in the capacitor 80, and a current corresponding to the voltage stored in the capacitor 80 flows to the OLED 310 through the driving TFT 20 such that the OLED 310 may emit light.

According to an exemplary embodiment of the present invention, the first electrode 311 may include a reflective layer, and the second electrode 313 may include a transflective layer. Accordingly, light generated in the light emitting layer 312 may pass through the second electrode 313 to be emitted outwards. For example, the OLED display device 201 may have a top-emission type structure.

At least one of a hole injection layer HIL and a hole transporting layer HTL may further be disposed between the first electrode 311 and the light emitting layer 312. At least one of an electron transporting layer ETL and an electron injection layer EIL may further be disposed between the light emitting layer 312 and the second electrode 313. The light emitting layer 312, the hole injection layer HIL, the hole transporting layer HTL, the electron transporting layer ETL, and the electron injection layer EIL may each include an organic material, and thus may be referred to as an organic layer.

A pixel defining layer 290 has an aperture. The aperture of the pixel defining layer 290 exposes a portion of the first electrode 311. The first electrode 311, the light emitting layer 312, and the second electrode 313 are sequentially stacked in the aperture of the pixel defining layer 290. In such an exemplary embodiment, the second electrode 213 may also be disposed on the pixel defining layer 290 as well as on the light emitting layer 312. In addition, the HIL, the HTL, the ETL, and the EIL may also be disposed between the pixel defining layer 290 and the second electrode 313. The OLED 310 emits light from the light emitting layer 312 in the aperture of the pixel defining layer 290. As such, the pixel defining layer 290 may define a light emission area.

The protection layer 350 is disposed on the second electrode 313. The protection layer 350 protects the OLED 310 from the external environment. The protection layer 350 may also be referred to as a capping layer. In addition, a thin film encapsulation layer in which an inorganic thin film and an organic thin film are alternately stacked may be disposed on the protection layer 350.

The window 390 is disposed on the protection layer 350. The window 390, along with the substrate 210, is configured to seal the OLED 310. The window 390, similar to the substrate 210, may include an insulating material such as glass, quartz, ceramic, plastic, and/or the like. Configurations from the substrate 210 to the window 390 are collectively referred to as a display panel or an organic light emitting panel. In addition, an upper surface of the window 390 in FIG. 18 corresponds to a display surface of the organic light emitting panel.

The light scattering film 100 is disposed on the window 390. The light scattering film 100 may use one of the light scattering films 101, 102, 103, 104, 105, 106, 107, and 108 as described above. The light scattering film 100 may increase color reproducibility and visibility from the lateral side of the OLED display device 201.

However, the invention is not limited thereto, and the polarization film 109 according to an exemplary embodiment of the present invention may be disposed on the window 390. The polarization film 109 may prevent reflection of external light incident to the OLED display device 201. In addition, as the polarization film 109 includes the light scattering film 100, the polarization film 109 may increase color reproducibility and visibility from the lateral side of the OLED display device 201.

Figure 19:
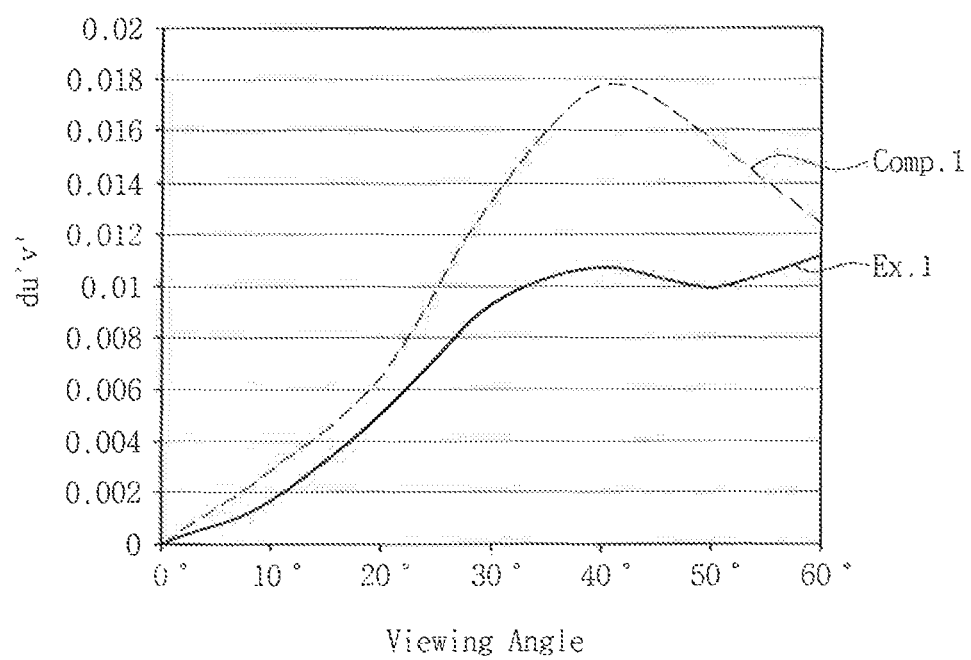
FIG. 19 is a graph illustrating side visibility of an organic light emitting diode ("OLED") display device according to an exemplary embodiment of the present inventive concept.

Hereinafter, color shift characteristics of an OLED display device will be described with reference to FIG. 19. FIG. 19 is a graph illustrating side visibility of an OLED display device.

A color shift (du'v') is measured, using an OLED display device (Experimental Example 1, hereinafter "EX. 1") in which the polarization film 109, according to an exemplary embodiment of the present invention, is disposed on a display surface of the organic light emitting panel and an OLED display device (Comparative Example 1, hereinafter "Comp. 1") in which the polarization film 109 according to the ninth exemplary embodiment is absent from the display surface of the organic light emitting panel.

In FIG. 19, a viewing angle is defined as an angle between a normal line of a display surface of the OLED display device and a line of sight of a user. Accordingly, the viewing angle of 0° corresponds to a case that the user views the OLED display device from the front.

The color shift (du'v') is defined as a deviation degree of chromaticity coordinates of a white color in accordance with the viewing angle from chromaticity coordinates of sRGB broadcast standard.

Referring to FIG. 19, as the viewing angle increases, the color shift (du'v') substantially increases on the whole. However, it shows that a degree of the color shift (du'v') of EX. 1 employing the polarization film 109 is less than that of Comp. 1 absent the polarization film 109. In particular, at the viewing angle of about 40°, the color shift (du'v') of Ex. 1 is less than the color shift (du'v') of Comp. 1 by about 40% of the color shift (du'v') of Comp. 1.

As such, when the polarization film 109, according to an exemplary embodiment of the present invention is used, the color shift of OLED display devices may be reduced, and accordingly, white angular dependency (WAD) of a white color based on a viewing angle may be reduced.

For example, a polarization film including one of the light scattering films 101, 102, 103, 104, 105, 106, 107, and 108 according to an exemplary embodiments of the present invention may reduce WAD of OLED display devices. Similarly, the light scattering films 101, 102, 103, 104, 105, 106, 107, and 108, according to an exemplary embodiments of the present invention, may reduce WAD of OLED display devices.

As set forth hereinabove, according to one or more exemplary embodiments, a light scattering film having excellent light scattering characteristics may be manufactured through a mechanical method using a microneedle or a chemical method using an etching solution.

From the foregoing, it will be appreciated that various embodiments in accordance with the present disclosure have been described herein for purposes of illustration, and that various modifications may be made without departing from the scope and spirit of the present teachings.

What is claimed is:

1. A method of manufacturing a light scattering film, the method comprising:
providing a light transmissive base having a film shape; and
defining a plurality of holes in the light transmissive base, using a perforating device by stamping the perforating device one or more times against the light transmissive base, the perforating device including a punching plate and a plurality of microneedles disposed on the punching plate,
wherein each of the plurality of holes has a diameter ranging from about 100 nm to about 5 µm,
wherein a spacing between each of the plurality of holes is about twice to about five times as large as an average diameter of each of the plurality of holes,
wherein the plurality of microneedles includes a first microneedle having a first diameter, a second microneedle having a second diameter different from the first diameter, and a third microneedle having a third diameter different from the first and second diameters, and
wherein the plurality of microneedles are spaced apart from each other on the punching plate by a first gap and a second gap that is different from the first gap.

2. The method as claimed in claim 1, wherein a density of the plurality of holes ranges from about $1 \times 10^7/cm^2$ to about $5 \times 10^8/cm^2$.

3. The method as claimed in claim 1, wherein the light transmissive base comprises at least one of a polyimide (PI)-based resin, a polyethylene terephthalate (PET)-based resin, a polyester (PE)-based resin, a polystyrene (PS)-based resin, an acrylic resin, a polycarbonate (PC)-based resin, or a cycloolefin polymer (COP).

4. The method as claimed in claim 1, wherein the defining of the plurality of holes includes using the perforating device two or more times.

5. The method as claimed in claim 1, wherein each of the plurality of microneedles has a diameter ranging from about 100 nm to about 5 µm.

6. A method of manufacturing a light scattering film, the method comprising:
providing a light transmissive base having a film shape; and
defining a plurality of holes in the light transmissive base, using a perforating device,
wherein each of the plurality of holes has a diameter ranging from about 100 nm to about 5 µm,
wherein a spacing between each of the plurality of holes is about twice to about five times as large as an average diameter of each of the plurality of holes,
wherein the perforating device comprises:
a punching roller; and
a plurality of microneedles disposed on the punching roller, wherein each of the plurality of microneedles has a diameter ranging from about 100 nm to about 5 µm, and
wherein one or more of the plurality of microneedles has a curved portion that is bent in a lengthwise direction or has an inclination angle with respect to a normal line of a surface of the punching roller in a range from about 20° to about 40°.

7. The method as claimed in claim 6, wherein the perforating device further comprises a transfer roller opposing the punching roller, and when the light transmissive base is transferred between the punching roller and the transfer roller, the plurality of holes is defined in the light transmissive base.

8. A method of manufacturing a light scattering film, the method comprising:

providing a light transmissive base having a film shape; and defining a plurality of recessed portions in the light transmissive base, using a perforating device, wherein each of the plurality of recessed portions has a depth that is smaller than a thickness of the light transmissive base and has a diameter ranging from about 100 nm to about 5 μm, and wherein the perforating device comprises a first perforating device perforating a first surface of the light transmissive base and a second perforating device perforating a second surface of the light transmissive base that is opposite to the first surface of the light transmissive base, and wherein the perforating device includes a plurality of microneedles disposed on a punching plate, the plurality of microneedles including a first microneedle having a first diameter, a second microneedle having a second diameter different from the first diameter, and a third microneedle having a third diameter different from the first and second diameters, and the plurality of microneedles are spaced apart from each other on the punching plate by a first gap and a second gap that is different from the first gap.

9. The method as claimed in claim 8, wherein a spacing between each of the plurality of recessed portions is about twice to about five times as large as an average diameter of each of the plurality of recessed portions.

10. The method as claimed in claim 8, wherein the plurality of recessed portions has a density ranging from about $1\times10^7/cm^2$ to about $5\times10^8/cm^2$.

11. A method of manufacturing a light scattering film, the method comprising:

providing a light transmissive base having a film shape;

creating a crack on a surface of the light transmissive base by colliding a bead into the light transmissive base; and selectively etching the light transmissive base, using an etching solution.

12. The method as claimed in claim 11, wherein the etching solution comprises at least one of sulfuric acid ($H_2SO_4$), hydrofluoric acid (HF), or hydrochloric acid (HCl).

13. The method as claimed in claim 11, wherein the bead comprises at least one of an acrylic resin, a polystyrene (PS) resin, a polyvinyl chloride resin, a polycarbonate (PC) resin, a polyethylene terephthalate (PET) resin, a polyethylene (PE) resin, a polypropylene (PP) resin, a polyimide (PI) resin, glass, silica, or steel.

14. The method as claimed in claim 11, wherein a plurality of holes are defined in the light transmissive base through the etching, each of the plurality of holes has a diameter ranging from about 100 nm to about 5 μm, and a spacing between each of the plurality of holes is about twice to about five times as large as an average diameter of the holes.

15. The method as claimed in claim 11, wherein a plurality of recessed portions is defined in the light transmissive base through the etching, and each of the plurality of recessed portions has a depth that is smaller than a thickness of the light transmissive base and has a diameter ranging from about 100 nm to about 5 μm.

* * * * *